United States Patent [19]

Chopra et al.

[11] Patent Number: 5,724,727
[45] Date of Patent: Mar. 10, 1998

[54] METHOD OF FORMING ELECTRONIC COMPONENT

[75] Inventors: Mona A. Chopra, Austin; Everitt W. Mace, Hutto; Brian D. Young, Austin, all of Tex.

[73] Assignee: Motorola, Inc., Schaumburg, Ill.

[21] Appl. No.: 689,571

[22] Filed: Aug. 12, 1996

[51] Int. Cl.⁶ ................................................ H05K 3/30
[52] U.S. Cl. ........................... 29/832; 29/846; 427/96
[58] Field of Search ......................... 29/825, 846, 832, 29/890; 427/96

[56] References Cited

U.S. PATENT DOCUMENTS

| | | | |
|---|---|---|---|
| 5,204,055 | 4/1993 | Sacha et al. | 419/2 |
| 5,283,949 | 2/1994 | Jurisich . | |
| 5,342,919 | 8/1994 | Dickens, Jr. et al. | 528/323 |
| 5,382,308 | 1/1995 | Bourell et al. | 156/62.2 |
| 5,431,967 | 7/1995 | Manthiram et al. | 427/535 |

FOREIGN PATENT DOCUMENTS 2-225357   9/1990   Japan .

*Primary Examiner*—Carl J. Arbes
*Attorney, Agent, or Firm*—Keith E. Witek

[57] ABSTRACT

An electronic component (15) such as a printed circuit board (PCB) is formed using a sintering process. A layer of dielectric powder (11) is partially converted to a solid layer of dielectric material (14) by exposing selective portions of the powder (11) to a laser (17). A layer of conductive powder (20) is then formed over the solid layer of dielectric material (14) and selectively sintered to form a solid layer of conductive material (19). This process can be used to form an interconnect structure (45), a coaxial structure (60), a cavity (89), a trench structure (90), or a slug (91), conductive traces (19), bond pads (31), or any other circuit board structure.

20 Claims, 5 Drawing Sheets

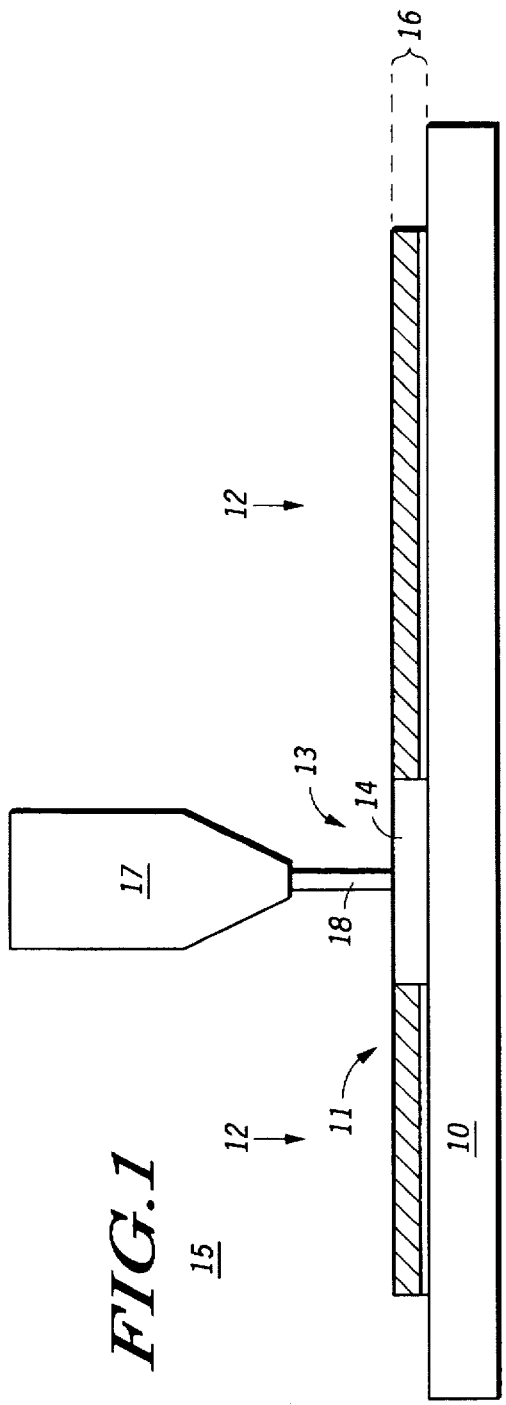
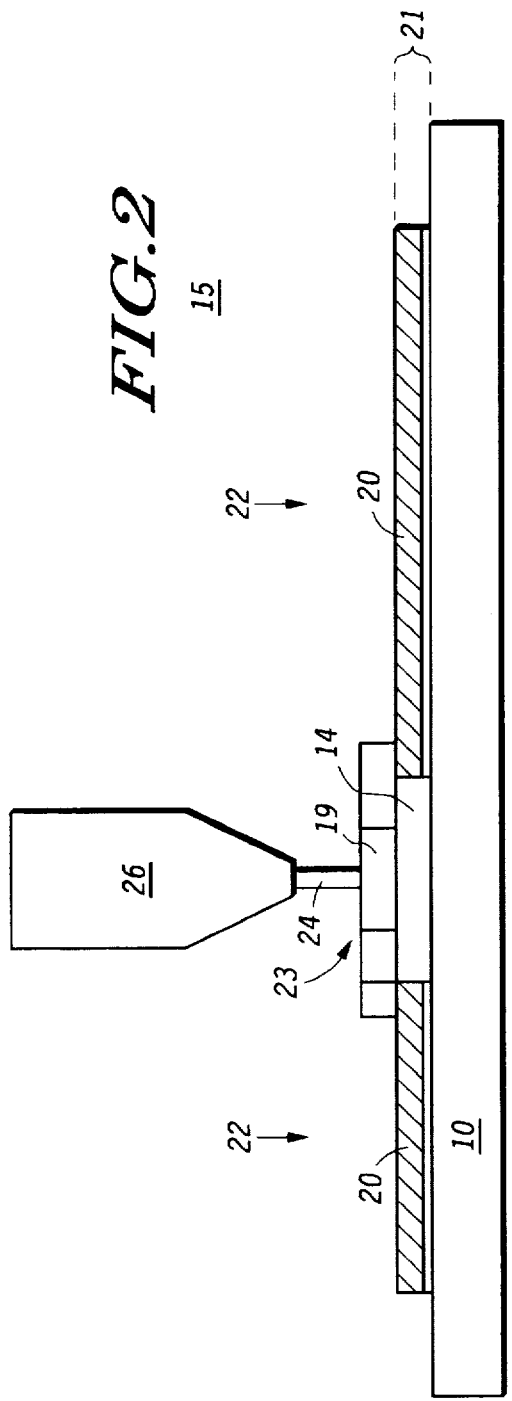

METHOD OF FORMING ELECTRONIC COMPONENT

FIELD OF THE INVENTION

This invention relates, in general, to electronic components, and more particularly to electronic components formed on a substrate.

BACKGROUND OF THE INVENTION

The assembly process of many electronic components, such as semiconductor devices, involves mounting the electronic component to a substrate such as a printed circuit board (PCB) or a ball grid array (BGA) substrate. Such substrates typically have multiple layers of metal interconnect that are encased in layers of dielectric material. They are commonly formed using the sequence of depositing a dielectric material, depositing a conductive layer, patterning the conductive layer with a layer of photoresist, removing portions of the conductive layer with an acid etch, and then repeating the sequence to form the necessary electrical connections.

Due to the expense of this repeating process, such techniques are limited in the complexity of the interconnect structures that can be formed. The above mentioned technique for forming a printed circuit board (PCB) is also very time consuming due to the photolithographic, etching, and lamination processes that each much be performed with little margin for error. In addition, the process to form such boards involve environmentally hazardous chemicals that require great care in their handling.

It should be appreciated that it would be advantageous to provide a method for forming a PCB or BGA board that did not require the use of environmentally hazardous chemicals. In addition, it would also be advantageous if the method could be used to form structures that are not practical to form with some previously known techniques.

BRIEF DESCRIPTION OF THE DRAWINGS

FIG. 1 is an enlarged cross-sectional view of an electronic component at an early stage in the fabrication process in accordance with the present invention;

FIG. 2 is an enlarged cross-sectional view of the electronic component at a later stage in the fabrication process in accordance with the present invention;

DETAILED DESCRIPTION OF THE PRESENT INVENTION

Figure 3:
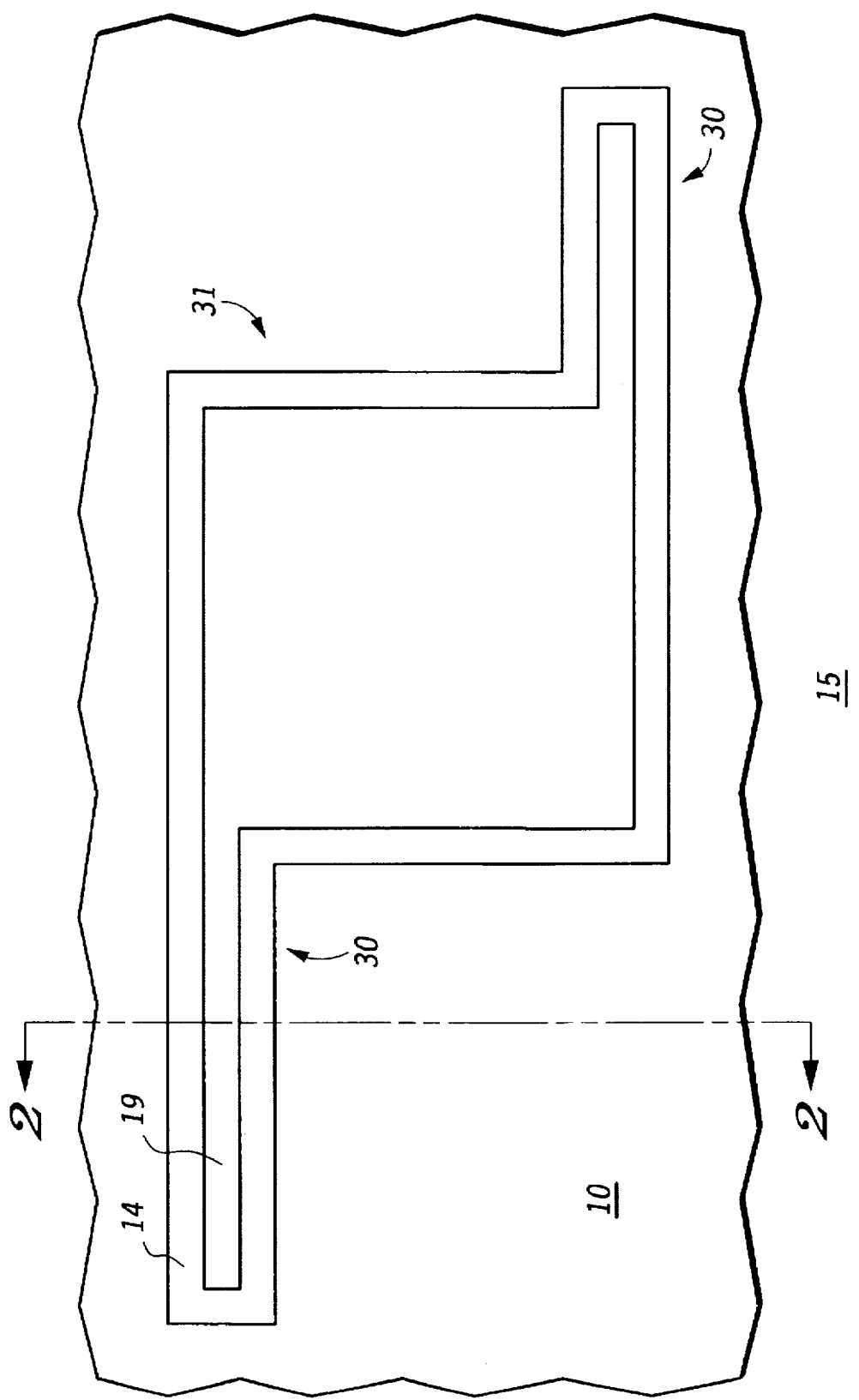
FIG. 3 is a top perspective plane view of the electronic component in accordance with the present invention.

In general, the present invention provides a novel method for forming a substrate to be used in conjunction with, or as part of, an electronic component. The method uses a sintering process to convert and pattern layers of powder into the intermediate layers of the substrate. A repeating pattern of dielectric and conductive powders is formed and sintered to provide the necessary electrical connections within the substrate. The process is also used to form other structures such as a cavity used to contain an electronic component, a trench to be used to cool an electronic component, and a coaxial interconnect structure.

Turning now to FIGS. 1–9, a more detailed description of the present invention is provided.

FIG. 1 is an enlarged cross-sectional view of an electronic component 15 at an early stage in the fabrication process. Electronic component 15, in accordance with the present invention, can be a variety of materials such as a printed circuit board (PCB, a ball grid array (BGA) board, a pin grid array (PGA) board, a multi-chip module (MCM), or the like. The method of the present invention begins by forming a layer of dielectric powder 11 on a substrate 10. Substrate 10 is a base that is used simply to provide temporary support to electronic component 15 during the fabrication process, however, substrate 10 could also be retained as a integral part of finished electronic component 15. Layer of dielectric powder 11 has a thickness 16 of about 5 microns to 500 microns, and more preferably, of less than about 50 microns to produce a thinner overall board design. A variety of sinterable materials can be used to form layer of dielectric powder 11 such as polyimide, aluminum dioxide, aluminum nitride, or the like.

Layer of dielectric powder 11 has two regions, namely a first region 12, which is not sintered and remains a powder, and a second region 13, which is sintered. Using a laser 17, or other energy source, an energy beam 18 is used to convert the second region 13 of the layer of dielectric powder 11 to a solid layer of dielectric material 14 via sintering. Preferably, laser 17 is a carbon dioxide ($CO_2$) laser that generates a beam 18 that has an energy of about 5 watts to 500 watts. Other lasers or energy sources could be used in accordance with the present invention and one skilled in the art will understand the sintering requirements of the material used to form layer of dielectric powder 11. Laser 17 is free to move in all directions parallel with the surface of substrate 10 so that it can sinter layer of dielectric powder 11 to form a pattern of solid layer of dielectric material 14 as will be illustrated shortly. Once the sintering process is complete, first regions 12 of layer of dielectric powder 11, which are still in powder form, are optionally removed.

Turning now to FIG. 2, the process of forming electronic component 15 continues by forming a layer of conductive powder 20 on substrate 10 including the portions of solid layer of dielectric material 14. Layer of conductive powder 20 has a thickness 21 of about 5 microns to 500 microns, and more preferably, thickness 21 is less than about 50 microns. Layer of conductive powder 20 can be formed from a variety of sinterable materials including, aluminum, tungsten, molybdenum, copper, silver, gold, and other conductive compositions, alloys, or elements.

Layer of conductive powder 20 has two regions, namely a first region 22, which is not to be sintered, and a second region 23, which is sintered. A laser 26 is used to provide a beam 24 of energy that is used to sinter second region 23 of layer of conductive powder 20 to form a solid layer of conductive material 19. Laser 26 can be the same laser 17 used to form solid layer of dielectric material 14 or another type of laser depending on the requirements of the sinterable material used. The energy from beam 24 does not melt layer of conductive powder 20 in second region 23, but rather converts the powder to a cohesive mass to form solid layer of conductive material 19. Because the present invention employs materials that are in powder form, it is possible to reclaim the powder that was not sintered for later use, thereby reducing manufacturing costs and reducing fabrication waste. The present invention also has the benefit of no longer needing the use of environmentally hazardous chemicals to form printed circuit boards since acid etch processing is not required. A width of the sintered regions 14 and 19 can be controlled by a path and/or programmed pattern of the lasers 17 and 26 along with the power of the beams 18 and 24.

FIG. 3 is a plane view showing electronic component 15 as formed in FIG. 2 (along section lines 2). Because both lasers 17 and 26 can be moved in any direction across substrate 10, solid layer of dielectric material 14 and solid layer of conductive material 19 can be shaped into a variety of patterns such as those illustrated in FIG. 3. As shown, interconnect lines 30 can be formed, which are connected to a bonding pad 31 can be formed. If electronic component 15 is a multi-level module (MLM), bonding pad 31 can be part of a via structure that is used to provide electrical connection between the interconnect lines 30 shown in FIG. 3 and an overlying layer (not shown). The process described above can be repeated using the same or different materials to form multiple layers of conductive and non-conductive layers. The repeating layers can also be used to form structures that have a thickness that is greater than what could be formed using a single layer of sintered powder.

Figure 4:
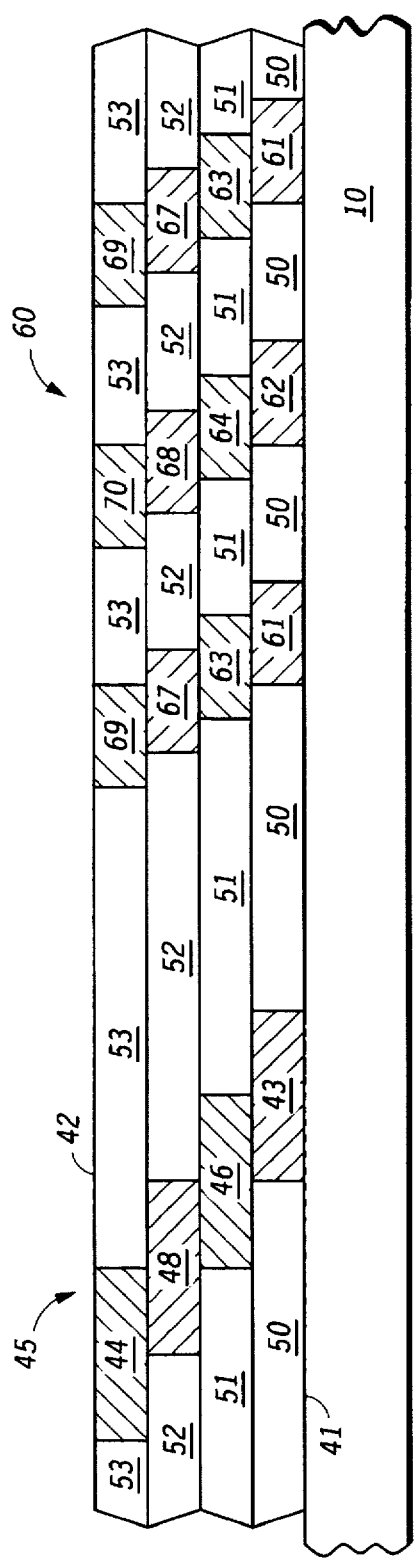
FIG. 4 is an enlarged cross-sectional view of structures formed in accordance with the present invention.

FIG. 4 illustrates a few of the structures that can be formed using the method of the present invention. An interconnect structure 45 can be formed in a board 40. As shown, board 40 is formed using four layers of material and has a top surface 42 and a bottom surface 41. A contact region 44 and 43 is formed as part of interconnect structure 45 on top surface 42 and bottom surface 41, respectively. If board 40 is used for the mounting of electronic components, such as semiconductor devices, then contact regions 43 and 44 can be used to couple electrical signals or power supply voltages between elements located on or within board 40. Contact regions 43 and 44 can also be bonding pads used in an assembly process to form solder balls, a pin grid array, or the like.

To provide an electrical connection between contact region 43 and contact region 44, a via-like structure is formed using intermediate conductive layers 48 and 46 to make the necessary electrical connection. A method of forming interconnect structure 45 is now provided. The sintering process described above is used to first form a first insulating layer 50 on support substrate 10. Portions of the dielectric powder are not sintered to provide an exposed region of substrate 10. Contact region 43 is then formed in this exposed region by sintering a layer of conductive powder (not shown) in this exposed region within layer 50. A second insulating layer 51 is then formed by sintering so that a portion of contact region 43 is exposed. A first solid layer of conductive material 46 is then formed by sintering a layer of conductive powder (not shown) such that a portion 46 is in contact with contact region 43. A third insulating layer 52 is then formed such that a portion of first solid layer of conductive material 46 is exposed and a second solid layer of conductive material 48 is formed such that a portion is in contact with first solid layer of conductive material 46. A fourth insulating layer 53 is then formed using the sintering process so that a portion of second solid layer of conductive material 48 is exposed. Contact region 44 is then formed with the sintering process so that it is in electrical contact with second solid layer of conductive material 48.

The present invention can also be used to form a coaxial structure 60 in substrate 40 as shown in FIG. 4. Coaxial structure 60 comprises a plurality of insulating and conductive layers with each layer have a first conductive region 62, 64, 68, and 70 that is encircled by a second conductive region 61, 63, 67, and 69, respectively. Each of the second conductive regions 61, 63, 67, and 69 is physically separated from the corresponding first conductive region 62, 64, 68, and 70 by one of the four insulating layers 50 to 53 as shown in FIG. 4. The conductive core 62, 64, 68, and 70 may also be capped on top by a dielectric/metal sintered layer wherein the dielectric isolates the core 62, 64, 68, and 70 from the metal and wherein this top metal layer is coupled to the layers 61, 63, 67, and 69.

If a horizontally-conducting coaxial connection is desired, a bottom metal/dielectric sintered layer can wherein the dielectric isolates the core 62, 64, 68, and 70 from the metal and wherein this bottom metal layer is coupled to the layers 61, 63, 67, and 69 to insulate a bottom portion of the core 62, 64, 68, and 70. Therefore, the core of layers 62, 64, 68, and 70 which carries the electrical signal can be surrounded on top, bottom, and the sides by a conductive grounded sheath in a manner similar to conventional coaxial cable.

Figure 5:
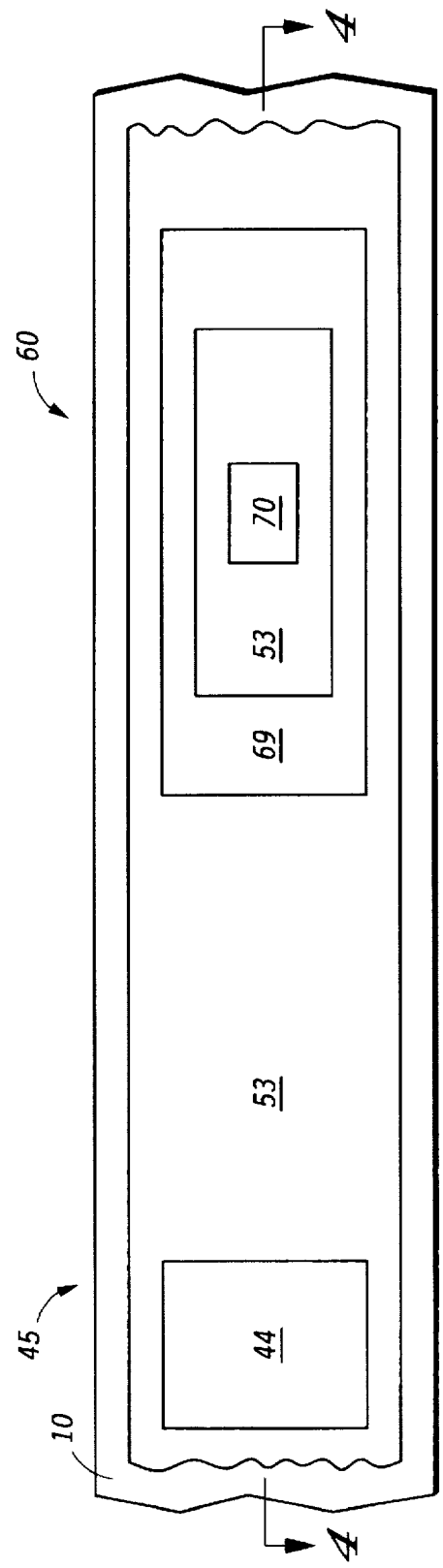
FIG. 5 is a top perspective view of the structures shown in FIG. 4.

A top view of a vertically-conducting coaxial structure 60 is shown in FIG. 5 and section lines 4 are used to illustrate where the cross-section for FIG. 4 is taken. The top layer of coaxial structure 60 includes first conductive region 70 that is completely surrounded by second conductive region 69. Fourth insulating layer 53 is used to provide electrical isolation between first conductive region 70 and second conductive region 69 so that second conductive region 69 can be used to provide shielding to an electrical signal traveling on first conductive region 70. Also shown in FIG. 5 is contact region 44, which is part of interconnect structure 45.

Figure 6:
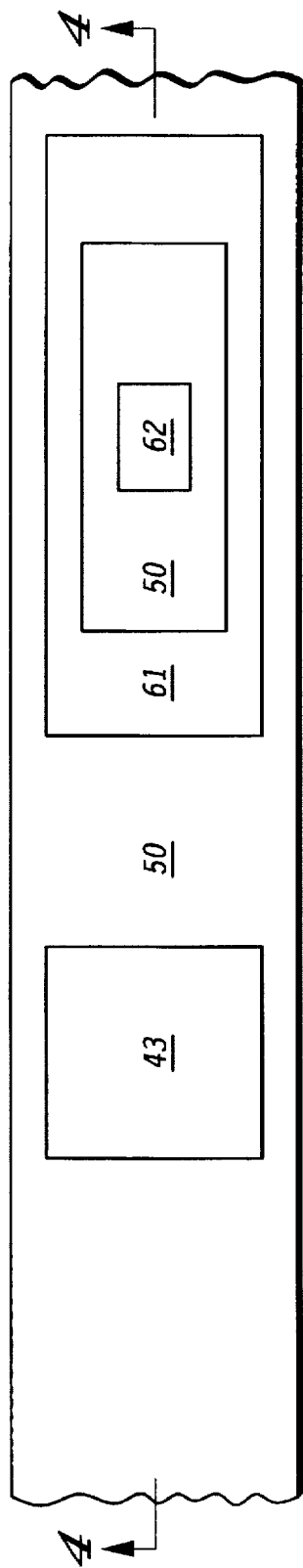
FIG. 6 is a bottom perspective view of the structures shown in FIG. 4.

FIG. 6 is a plane view of bottom surface 41 of substrate 40 as shown in FIG. 4. Second conductive region 61 encircles first conductive region 62 of coaxial structure 60. It should be understood that coaxial structure 60 could be formed such that second conductive region 61 surrounds a plurality of conductive regions so that a number of interconnect lines are shielded. In general, FIG. 6 is provided to illustrate how the pattern of coaxial structure 60 and interconnect structure 45 is shifted from the top surface 42 to the bottom surface 41 of substrate 40. It should be understood that substrate 40, interconnect structure 45, and coaxial structure 60 can be formed using any number of conductive and insulating layers and is not limited to the embodiments described above that use four layers. Coaxially shielded current can vertically flow perpendicular to the surfaces 41 and 42 of FIG. 4 between the regions 70 and 62 in FIGS. 5 and 6.

Figure 7:
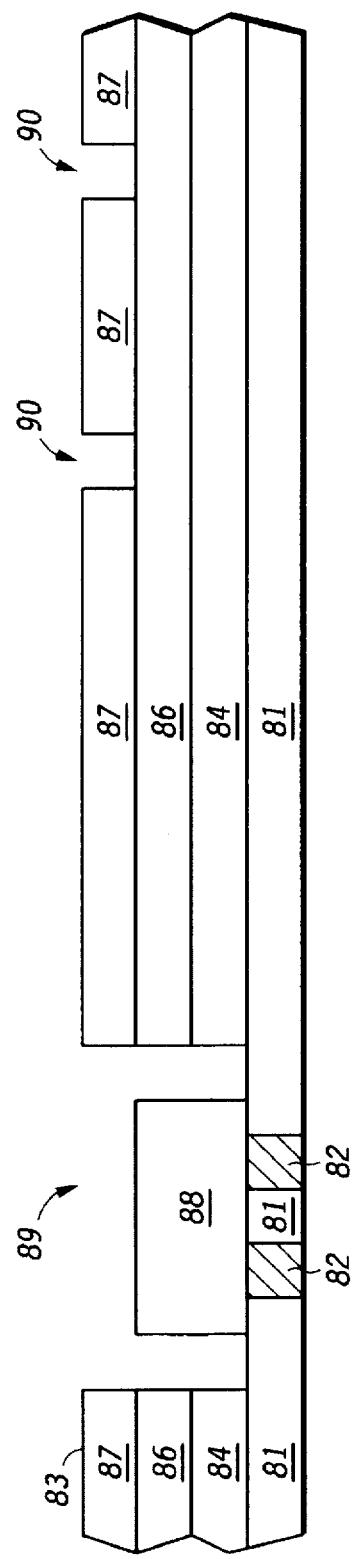
FIG. 7 is an enlarged cross-sectional view of additional structures that are formed in accordance with the present invention.

FIG. 7 illustrates additional structures that can be formed in a substrate 80 using the sintering process of the present invention. Substrate 80 has a top surface 83 and is formed primarily from four solid layers of dielectric material 81, 84, 86, and 87. A recess or a cavity 89 can be formed in substrate 80 to encase an electronic component 88 such as a capacitor, a sensor, an integrated circuit, a resistor, a diode, a transistor, or the like. Cavity 89 is beneficial for providing physical isolation between various electronic components within a substrate 80 and can be used to improve the packing density of electronic components on substrate 80 by locating one electronic component over another.

Cavity 89 is formed using the sintering process described above and begins by forming solid layer of dielectric material 81 and contact regions 82. The formation of contact regions 82 should be considered optional and are used to provide electrical connection to electronic component 88 if necessary. Each of the three remaining solid layers of dielectric material 84, 86, and 87 are formed by depositing a layer of dielectric powder and then sintering each layer except where cavity 89 is formed. After the solid layers of dielectric material 84, 86, and 87 are formed, the unsintered powder is removed to provide cavity 89.

Figure 8:
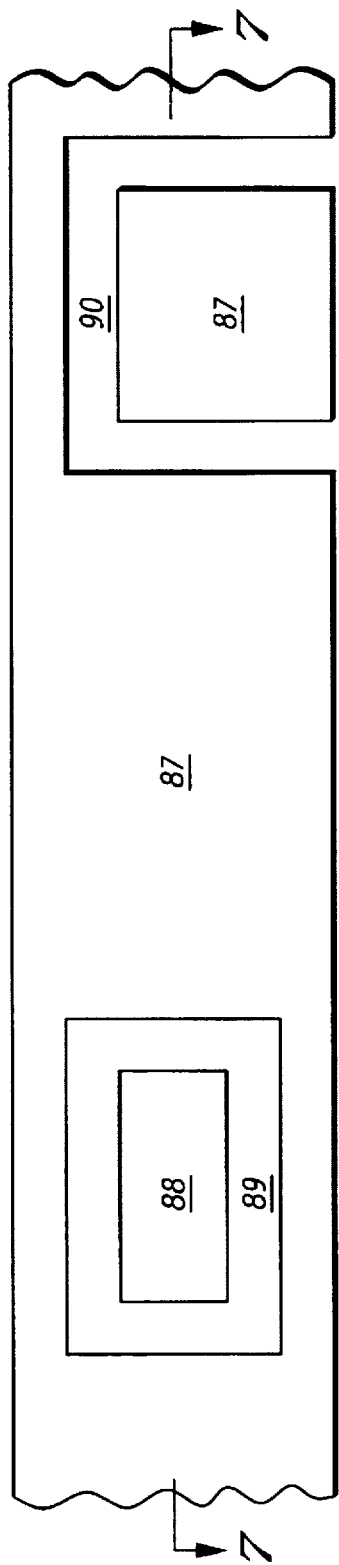
FIG. 8 is a top view of the additional structures shown in FIG. 7.

Also shown in FIG. 7 is a portion of a trench structure 90 that is formed at the top surface 83 of substrate 80 in the fourth solid layer of dielectric material 87. Trench structure 90 is formed by not sintering the dielectric powder used to form fourth solid layer of dielectric material 87 where trench structure 90 is formed. Turning now to FIG. 8 an application for trench structure 90 is provided. FIG. 8 is a top view of cavity 89 and trench structure 90. Section lines 7 are used to indicated where the cross-section is taken for FIG. 7.

Trench structure 90 can have a variety of uses such as in a method for cooling a portion of substrate 80 (in a manner similar to a heat sink). Trench structure 90 can be used as a channel to run cooling fluid through various portions of substrate 80. Thus, trench structure 90 can be used to cool, via liquid flow, an overlying or underlying electronic component (not shown) while it is under operation. It should also be understood that trench structure 90 could be used to heat an electronic component (not shown) to perform reliability or performance verification of the electronic component. In addition, trench structure 90 could be covered with a dielectric or conductive material to provide buried tubes passing through substrate 80.

Figure 9:
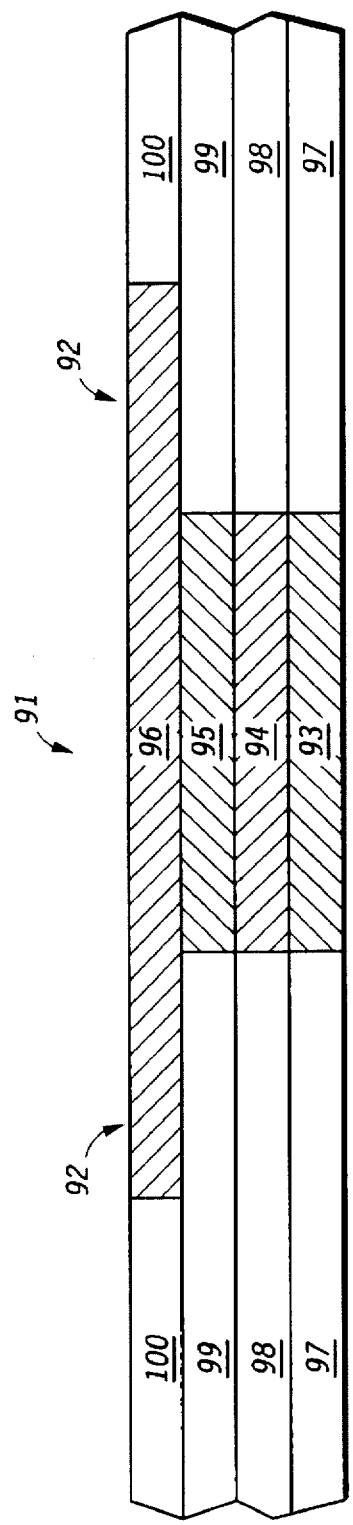
FIG. 9 is an enlarged cross-sectional view of a slug formed in accordance with the present invention.

Referring now to FIG. 9, the sintering process of the present invention can also be used to form a slug 91 that is connected to contact regions 92. Slug 91 is formed in a substrate 101 and can be used to provide a voltage potential, such as a ground plane, to an electronic component (not shown) that is in electrical contact with contact regions 92. Slug 91 can also be used to provide improved thermal performance as it will distribute the heat generated by an electronic component that is in contact with slug 91. Slug 91 is formed by building up conductive and non-conductive regions in substrate 101. The non-conductive regions are formed using four solid layers of dielectric material 97 to 100, and slug 91 is formed from four solid layers of conductive material 93 to 96. Additional layers of varying thickness could also be formed to adjust the shape and size of slug 91.

By now it should be appreciated that the present invention provides a new use of a sintering process to form an electronic component such as a printed circuit board. The process uses powders to form each of the layers, and any of the powder that is unsintered can be reclaimed and reused. Therefore, the present invention obviates the need to use environmentally hazardous chemicals which reduces the manufacturing cost of electronic components that are formed using the sintering process of the present invention. The present invention also provides structures that can be formed using this process that may be more difficult or impractical to form using previously known deposition and etch fabrication techniques.

We claim:

1. A method of forming an electronic component comprising the steps of:

providing a substrate having a surface;

forming a first layer of dielectric powder on the surface of the substrate;

sintering at least a portion of the first layer of dielectric powder to form a first solid layer of dielectric material on the surface of the substrate;

forming a first layer of conductive powder overlying the first solid layer of dielectric material; and sintering at least a portion of the first layer of conductive powder to form a first solid layer of conductive material over the first solid layer of dielectric material, wherein the first solid layer of conductive material has a pattern and the first solid layer of dielectric material provides an underlying insulation layer for the first solid layer of conductive material, whereby the first solid layer of dielectric material underlies the first solid layer of conductive material.

2. The method of claim 1 wherein the first solid layer of conductive material is part of an interconnect line in a printed circuit board.

3. The method of claim 1 further comprising the steps of:

forming a second layer of dielectric powder overlying the first solid layer of conductive material, wherein the second layer of dielectric material is sinterable;

sintering at least a portion of the second layer of dielectric powder to form a second solid layer of dielectric material overlying a portion of the first solid layer of conductive material;

forming a second layer of conductive powder overlying the second solid layer of dielectric material, wherein the second layer of conductive powder is sinterable; and sintering at least a portion of the second layer of conductive powder to form a second solid layer of conductive material, wherein the second solid layer of conductive material has a pattern.

4. The method of claim 3 wherein a portion of the first solid layer of conductive material is in contact with a portion of the second solid layer of conductive material.

5. The method of claim 3 wherein the electronic component has a top surface and a bottom surface, and the pattern of the first solid layer of conductive material and the pattern of the second solid layer of conductive material provide an electrical connection from the top surface of the electronic component to the bottom surface.

6. The method of claim 5 wherein the pattern of the first solid layer of conductive material and the pattern of the second solid layer of conductive material each comprises a first region and a second region, wherein the second region encircles the first region and is physically isolated from the first region.

7. The method of claim 1 further comprising the step of removing a remaining portion of the first layer of dielectric powder prior to forming the first layer of conductive powder.

8. The method of claim 1 further comprising the steps of:

forming a plurality of layers of dielectric powder overlying the substrate with each of the plurality of layers of dielectric powder having a first region and a second region:

sintering the first region of each of the plurality of layers of dielectric powder; and removing the second region of each of the plurality of layers of dielectric powder to form a cavity in the electronic component.

9. The method of claim 1 wherein the first layer of dielectric powder and the first layer of conductive powder are both less than about 50 microns thick.

10. The method of claim 1 wherein the first layer of dielectric powder is selected from the group consisting of polyimide, aluminum dioxide, and aluminum nitride.

11. The method of claim 1 wherein the first layer of conductive powder is selected from the group consisting of aluminum, tungsten, molybdenum, copper, silver, and gold.

12. The method of claim 1 wherein the first layer of dielectric powder is sintered using a laser with an energy of about 300 watts to 500 watts.

13. A method of forming a substrate having a cavity, the method comprising the steps of:
   a) forming a layer of dielectric powder overlying a portion of the substrate, wherein the layer of dielectric powder has a first region and a second region;
   b) sintering the second region of the layer of dielectric powder to form a solid layer of dielectric material;
   c) removing the first region of the layer of dielectric powder to provide a portion of the cavity; and
   repeating steps a, b, and c zero or more times to complete a formation of the cavity in the substrate.

14. The method of claim 13 further comprising the step of placing an electronic component into the cavity.

15. The method of claim 14 wherein the electronic component is selected from the group consisting of a capacitor, a sensor, an integrated circuit, a transistor, a diode, and a resistor.

16. The method of claim 13 wherein the cavity provides a trench pattern across a surface of the substrate.

17. A method of forming an electronic component having a contact region on a top surface, a contact region on a bottom surface, and an interconnect structure to couple the contact region on the top surface to the contact region on the bottom surface, the method comprising the steps of:
   providing a substrate having a surface;
   forming a first layer of dielectric powder on the surface of the substrate, wherein the first layer of dielectric powder is sinterable and has a first region and a second region; sintering the first region of the first layer of dielectric powder to form a first solid layer of dielectric material;
   forming a first layer of conductive powder overlying the first solid layer of dielectric material, wherein the first layer of conductive powder is sinterable and has a first region and a second region; and
   sintering the first region of the first layer of conductive powder to form a first solid layer of conductive material, wherein the first solid layer of conductive material couples the contact region on the top surface to the contact region on the bottom surface.

18. The method of claim 17 wherein the first layer of conductive powder further comprises a third region that is sinterable, and the method further comprises the step of sintering the third region of the first layer of conductive powder to form a second solid layer of conductive material, which provides a slug and the first solid layer of conductive material and the second solid layer of conductive material are coupled to each other.

19. The method of claim 17 wherein the first layer of conductive powder further comprises a third region that is sinterable, and the method further comprises the step of sintering the third region of the first layer of conductive powder to provide a second solid layer of conductive material, and the second solid layer of conductive material encircles the first solid layer of conductive material and is physically separated from the first solid layer of conductive material.

20. The method of claim 17 further comprising the steps of:
   forming a second layer of dielectric powder overlying the first solid layer of conductive material, wherein the second layer of dielectric powder is sinterable;
   sintering at least a portion of the second layer of dielectric powder to form a second solid layer of dielectric material;
   forming a second layer of conductive powder overlying the second solid layer of dielectric material, wherein the second layer of conductive powder is sinterable; and
   sintering at least a portion of the second layer of conductive powder.

* * * * *